(12) United States Patent
Bissey

(10) Patent No.: US 6,169,696 B1
(45) Date of Patent: *Jan. 2, 2001

(54) METHOD AND APPARATUS FOR STRESS TESTING A SEMICONDUCTOR MEMORY

(75) Inventor: Lucien J. Bissey, Boise, ID (US)

(73) Assignee: Micron Technology, Inc., Boise, ID (US)

( * ) Notice: Under 35 U.S.C. 154(b), the term of this patent shall be extended for 0 days.

This patent is subject to a terminal disclaimer.

(21) Appl. No.: 09/416,371

(22) Filed: Oct. 12, 1999

Related U.S. Application Data

(63) Continuation of application No. 09/145,849, filed on Sep. 2, 1998, now Pat. No. 5,999,467, which is a continuation of application No. 08/940,310, filed on Sep. 30, 1997, now Pat. No. 5,848,017.

(51) Int. Cl.[7] .................................................... G11C 7/00
(52) U.S. Cl. ......................... 365/201; 365/205; 365/214
(58) Field of Search .................................. 365/201, 202, 365/214, 190, 205

(56) References Cited

U.S. PATENT DOCUMENTS

| | | | |
|---|---|---|---|
| Re. 34,718 | 9/1994 | Tobita | 365/201 |
| 5,298,433 | 3/1994 | Furuyama | 437/8 |
| 5,339,273 * | 8/1994 | Taguchi | 365/201 |
| 5,367,492 | 11/1994 | Kawaoto et al. | 365/201 |
| 5,469,393 | 11/1995 | Thomann | 365/201 |
| 5,544,108 | 8/1996 | Thomann | 365/201 |
| 5,726,939 | 3/1998 | Cho et al. | 365/201 |
| 5,848,017 * | 12/1998 | Bissey | 365/201 |

* cited by examiner

Primary Examiner—Richard Elms
Assistant Examiner—Tuan T. Nguyen
(74) Attorney, Agent, or Firm—Trask Britt

(57) ABSTRACT

Circuitry stress tests a Dynamic Random Access Memory (DRAM) by connecting a sense amplifier of the DRAM to at least two pairs of complementary bitlines within the same sub-array of the DRAM through two pairs of isolation transistors activated at substantially the same time. The circuitry thus provides for the stress testing of memory cells associated with sense amplifiers connected to only one sub-array within a DRAM or other semiconductor memory. The apparatus also provides an alternative to conventional methods for stress testing memory cells associated with sense amplifiers connected to more than one sub-array within a DRAM or other semiconductor memory.

12 Claims, 4 Drawing Sheets

METHOD AND APPARATUS FOR STRESS TESTING A SEMICONDUCTOR MEMORY

CROSS REFERENCE TO RELATED APPLICATION

This application is a continuation of application Ser. No. 09/145,849, filed Sep. 2, 1998, now U.S. Pat. No. 5,999,467, which is a continuation of application Ser. No. 08/940,310, filed Sep. 30, 1997, now U.S. Pat. No. 5,848,017, issued Dec. 8, 1998.

BACKGROUND OF THE INVENTION

1. Field of the Invention

This invention relates in general to semiconductor memories and, more specifically, to stress testing of such memories.

2. State of the Art

As shown in FIG. 1, a portion 10 of a conventional Dynamic Random Access Memory (DRAM) (not shown in its entirety) includes sense amplifiers 12 and 14 shared by a pair of sub-arrays 16 and 18. During some read operations within the sub-array 16, an isolation signal ISO_2 activates isolation NMOS transistors 20 so logic bits on bitlines 22 within the sub-array 16 can be sensed by shared sense amplifiers 12 and 14. Meanwhile, another isolation signal ISO_3 deactivates isolation NMOS transistors 24 so signals on bitlines 26 within the sub-array 18 do not reach the shared sense amplifiers 12 and 14 during the read operations. Of course, some read operations in the sub-array 18 are performed in a complementary manner, with the isolation NMOS transistors 24 in an activated state and the isolation NMOS transistors 20 in a deactivated state.

As described in U.S. Pat. No. 5,339,273 to Taguchi, one method for stress testing the conventional DRAM involves reading a logic bit from one of the sub-arrays 16 and 18, for example, while both the isolation NMOS transistors 20 and the isolation NMOS transistors 24 are activated. This loads a memory cell (not shown) outputting the logic bit with approximately twice the normal bitline capacitance $C_{bitline}$. When the memory cell is weak, its stored charge q cannot overcome the doubled bitline capacitance $C_{bitline}$ to produce a voltage $V_{sense}$ at one of the sense amplifiers 12 and 14 that is of sufficient magnitude to be sensed (i.e., $V_{sense} = q \div C_{bitline}$, so that when $C_{bitline}$ doubles and q remains constant, $V_{sense}$ is cut in half). As a result, the logic bit may be misread, thereby identifying the memory cell as being weak. The row or column (not shown) containing the weak memory cell can then be replaced with a redundant row or column (not shown), or the DRAM can be scrapped.

Unfortunately, the Taguchi method described above does not work with sense amplifiers 28 and 30 positioned outside the sub-arrays 16 and 18, because these amplifiers 28 and 30 are each connected to only one of the sub-arrays 16 and 18. As a result, memory cells (not shown) connected to the sense amplifiers 28 and 30 through bitlines 32 and 34 and isolating NMOS transistors 36 and 38 (activated by isolation signals ISO_1 and ISO_4) cannot be loaded with double their normal bitline capacitance, and thus cannot be stress tested, using the described Taguchi method.

Therefore, there is a need in the art for an apparatus and method in a semiconductor memory, such as a DRAM, for stress testing memory cells associated with sense amplifiers connected to only one sub-array within the memory.

SUMMARY OF THE INVENTION

An apparatus in accordance with the present invention stress tests a semiconductor memory, such as a Dynamic Random Access Memory (DRAM), by connecting a sense amplifier of the semiconductor memory to at least two pairs of complementary bitlines within the same memory array, such as a sub-array, of the semiconductor memory through two pairs of isolation switches activated at substantially the same time by activating circuitry of the apparatus. The apparatus thus provides for the stress testing of memory cells associated with sense amplifiers connected to only one array or sub-array within a semiconductor memory. The apparatus also provides an alternative to the conventional Taguchi method described above for stress testing memory cells associated with sense amplifiers connected to more than one array or sub-array within a semiconductor memory.

In additional embodiments of the present invention, a semiconductor memory, an electronic system, a semiconductor wafer, and a DRAM device incorporate the inventive apparatus described above.

In an inventive method for stress testing a semiconductor memory, a sense amplifier of the semiconductor memory is switchably coupled to at least two pairs of complementary bitlines in the same memory array of the semiconductor memory at substantially the same time.

DETAILED DESCRIPTION OF THE INVENTION

Figure 1:
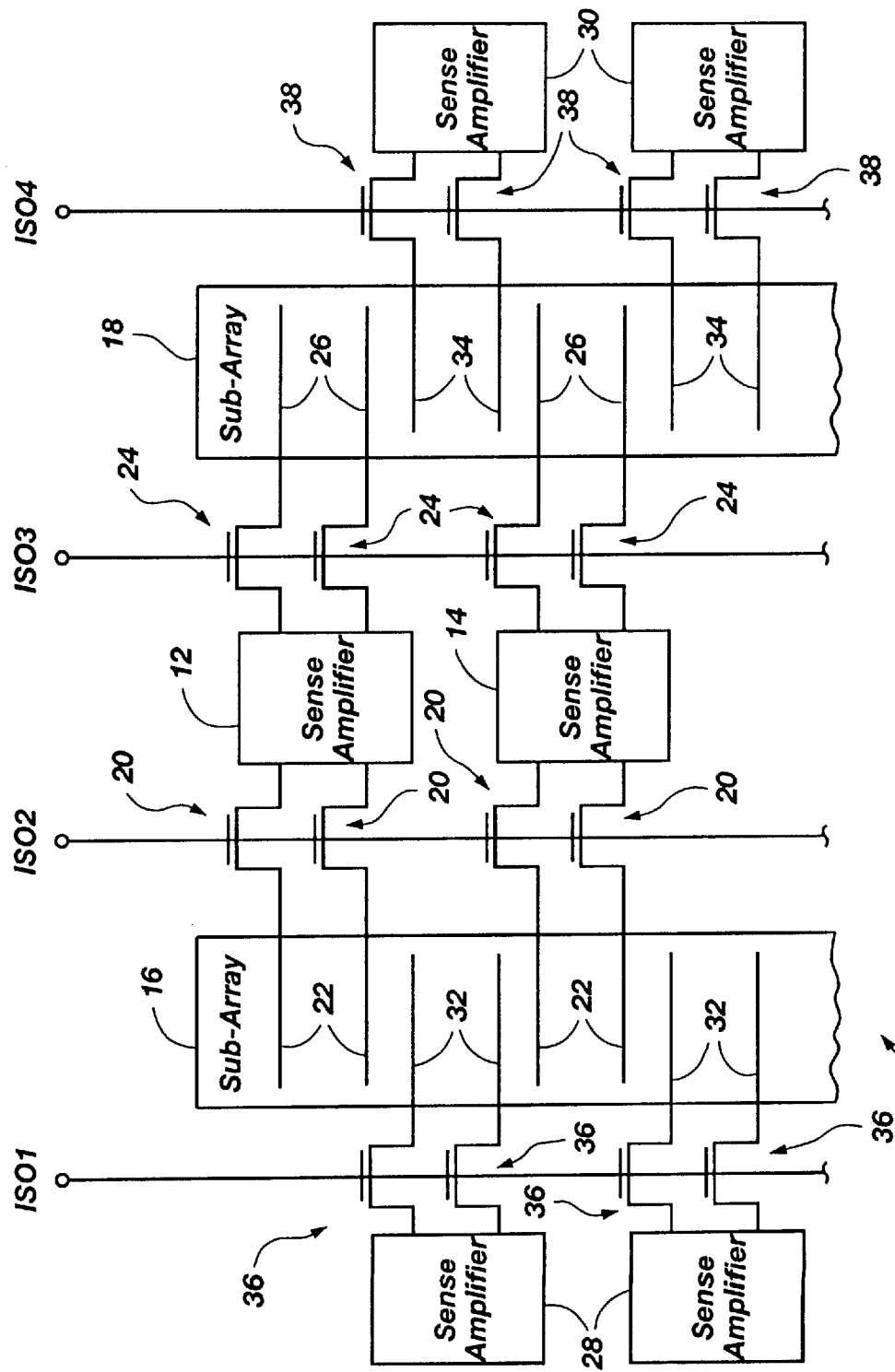
FIG. 1 is a block diagram and circuit schematic of a portion of a conventional Dynamic Random Access Memory (DRAM) to which a conventional stress testing method is applied.
Figure 2:
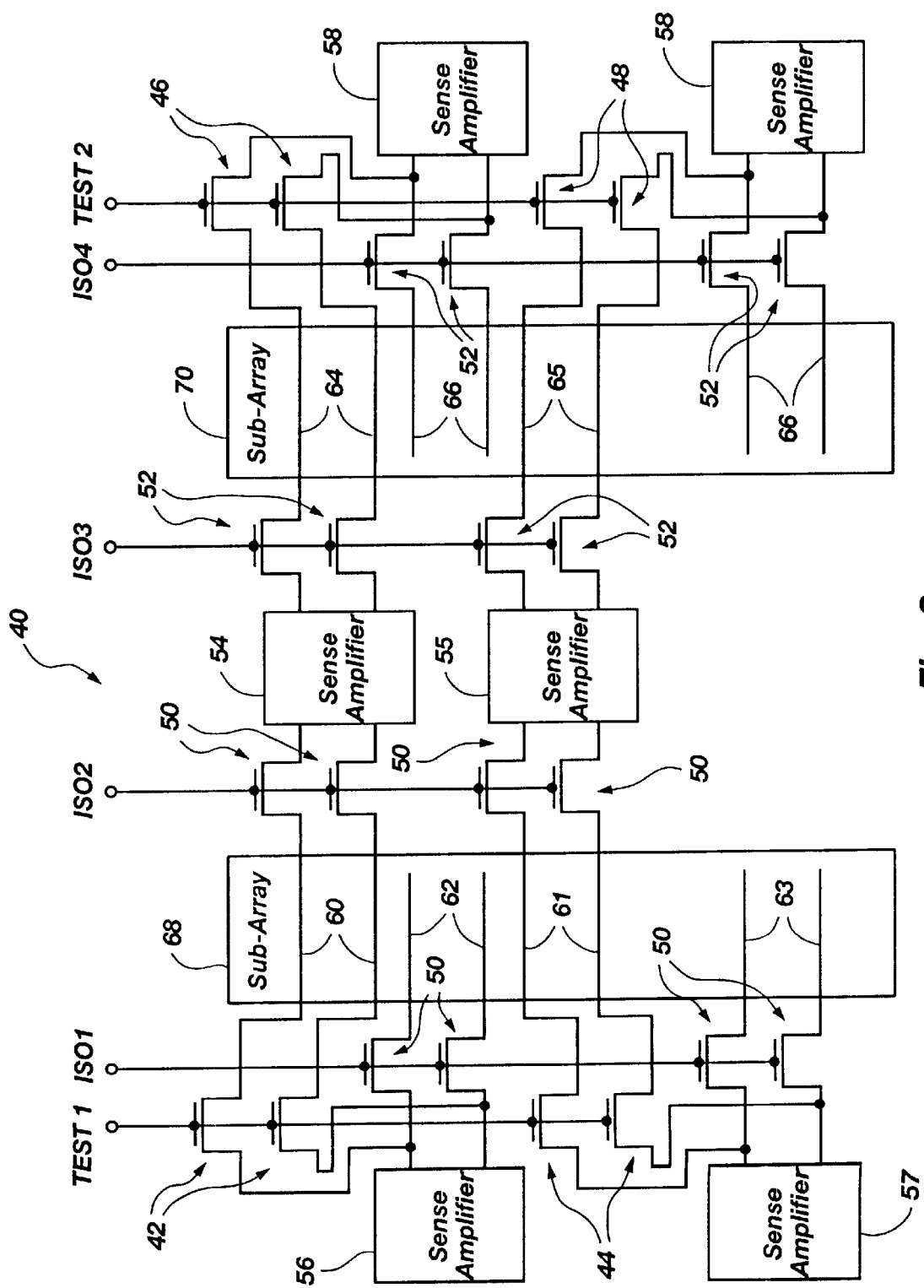
FIG. 2 is a block diagram and circuit schematic of a portion of a DRAM including circuitry for performing stress tests on the DRAM in accordance with the present invention.

As shown in FIG. 2, a portion 40 of a Dynamic Random Access Memory (DRAM) (not shown in its entirety) includes isolation NMOS transistors 42, 44, 46, 48, 50, and 52 connecting sense amplifiers 54, 55, 56, 57, and 58 to complementary pairs of bitlines 60, 61, 62, 63, 64, 65, and 66 within sub-arrays 68 and 70. Although the present invention will be described with respect to a DRAM, it will be understood by those having skill in the field of this invention that the invention is applicable to other semiconductor memories as well. Also, it will be understood that although the invention will be described in association with a semiconductor memory having multiple sub-arrays, it is equally applicable to semiconductor memories containing a single memory array.

During normal read operations on bitlines 60 within the sub-array 68, for example, a test signal TEST_1 deactivates the isolation transistors 42 to isolate the sense amplifier 56 from the bitlines 60. At the same time, an isolation signal ISO_2 activates the isolation transistors 50 so the sense amplifier 54 can sense a logic bit on the bitlines 60, and another isolation signal ISO_3 deactivates the isolation transistors 52 to isolate the sense amplifier 54 from the bitlines 64 in the sub-array 70.

The status of isolation signals ISO_1, ISO_2, ISO_3, and ISO_4, and the status of test signals TEST_1 and TEST_2, during all normal read operations within the sub-arrays 68 and 70 is summarized in the following table:

TABLE 1

Normal Operations

| Bitlines read | TEST_1 | ISO_1 | ISO_2 | ISO_3 | ISO_4 | TEST_2 |
|---|---|---|---|---|---|---|
| 62, 63 | low | high | low | low | low | low |
| 60, 61 | low | low | high | low | low | low |
| 64, 65 | low | low | low | high | low | low |
| 66 | low | low | low | low | high | low |

During stress testing of the DRAM, memory cells (not shown) associated with the bitlines 62 within the sub-array 68, for example, may be stress tested in accordance with the present invention in the following manner. The isolation signal ISO_1 activates the isolation transistors 50 to allow the bitlines 62 to be sensed by the sense amplifier 56. At the same time, the test signal TEST_1 activates the isolation transistors 42 to connect the bitlines 62 to the bitlines 60. As a result, memory cells associated with the bitlines 62 are loaded with twice their normal bitline capacitance, allowing for the identification of weak memory cells through misreads resulting from the doubled capacitance load in the same manner as previously described.

In general, stress testing of any of the bitlines 62, 63, and 66 occurs as summarized in the following table.

TABLE 2

Stress Testing Operations

| Bitlines read | TEST_1 | ISO_1 | ISO_2 | ISO_3 | ISO_4 | TEST_2 |
|---|---|---|---|---|---|---|
| 62, 63 | high | high | low | low | low | low |
| 66 | low | low | low | low | high | high |

The isolation transistors 42, 44, 46, and 48 are shown in FIG. 2 as being associated with sense amplifiers 56, 57, and 58, which are themselves each associated with only one of the sub-arrays 68 and 70. The embodiment of the present invention depicted in FIG. 2 is thus illustrated as providing a stress testing capability to bitlines 62, 63, and 66 which cannot be provided using the conventional Taguchi method previously described. However, it should be understood that additional isolation transistors (not shown) could also be provided so that, during a stress test of the DRAM, the sense amplifier 54, for example, can be connected to the bitlines 60 and 64 in accordance with the conventional Taguchi method, or can be connected to bitlines 60 and 62. The present invention thus provides an alternative means for conducting stress tests using sense amplifiers shared by two or more sub-arrays.

Figure 3:
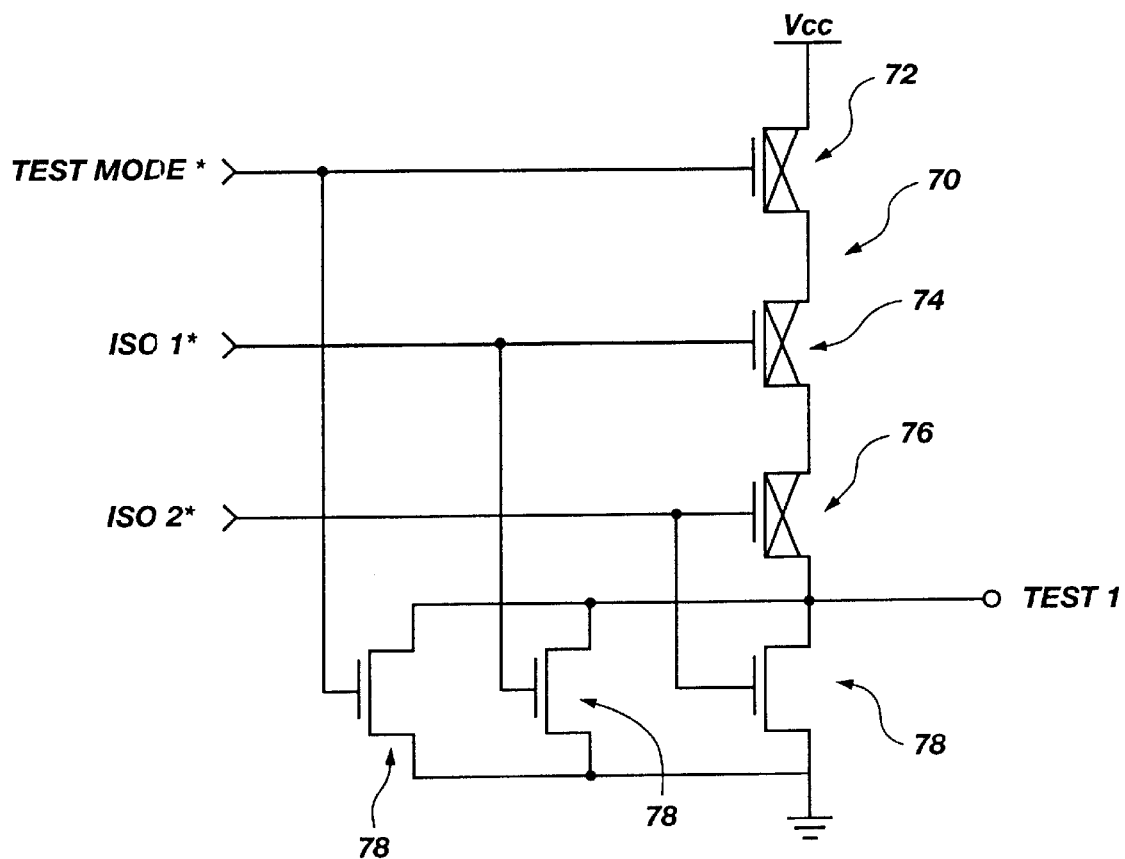
FIG. 3 is a circuit schematic showing circuitry for initiating a test mode in the stress testing circuitry of FIG. 2.

As shown in FIG. 3, activating circuitry 70 provides an active (i.e., high) test signal TEST_1 when a stress test mode signal TEST_MODE* activates a PMOS transistor 72, the complement ISO_1* of the isolation signal ISO_1 activates another PMOS transistor 74, and the isolation signal ISO_2 activates still another PMOS transistor 76. The activating circuitry 70 provides an inactive (i.e., low) test signal TEST_1 when the stress test mode signal TEST_MODE*, the complement signal ISO_1*, or the isolation signal ISO_2 activates any one of a group of NMOS transistors 78. Other activating circuitry (not shown) provides the test signal TEST_2, with the test signal TEST_2 being active (i.e., high) when the stress test mode signal TEST_MODE* is active (i.e., low), the isolation signal ISO_3 (FIG. 2) is inactive (i.e., low), and the complement ISO_4* of the isolation signal ISO_4 (FIG. 2) is active (i.e., low), and with the test signal TEST_2 being inactive (i.e., low) when either the stress test mode signal TEST_MODE* is inactive (i.e., high), the isolation signal ISO_3 is active (i.e., high), or the complement signal ISO_4* is inactive (i.e., high).

Figure 4:
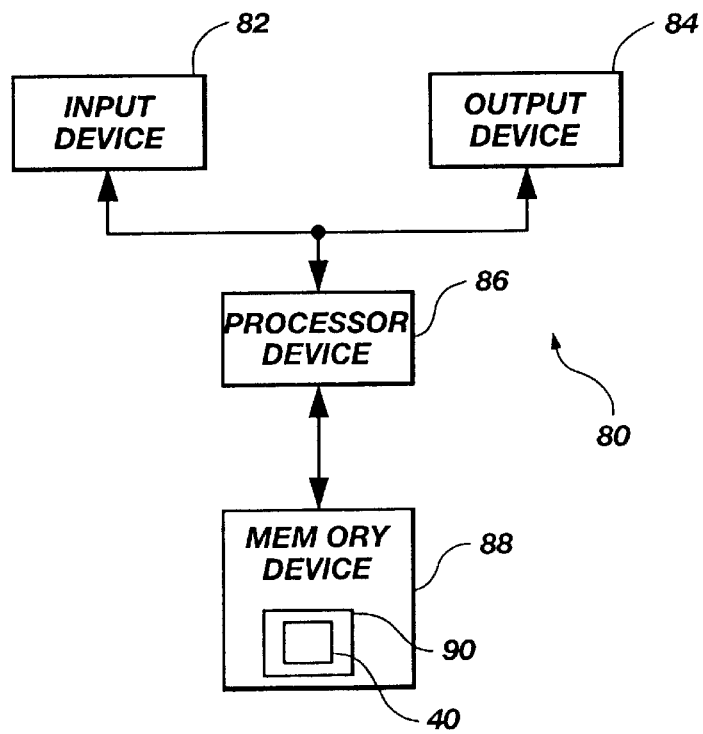
FIG. 4 is a block diagram of an electronic system incorporating the DRAM of FIG. 2.

As shown in FIG. 4, an electronic system 80 includes an input device 82, an output device 84, a processor device 86, and a memory device 88 that incorporates a DRAM 90 that includes the DRAM portion 40 of FIG. 2. Of course, it should be understood that any one of the input, output, processor, and memory devices 82, 84, 86, and 88 may incorporate the present invention.

Figure 5:
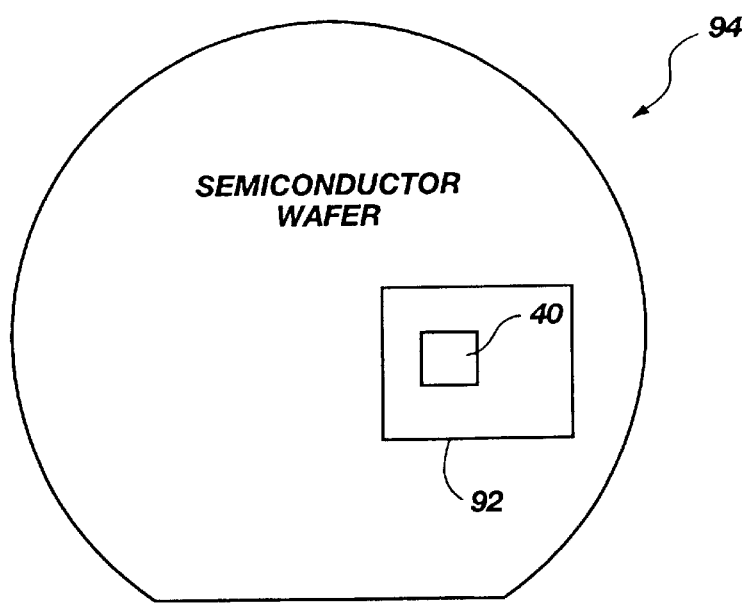
FIG. 5 is a diagram of a semiconductor wafer incorporating the DRAM of FIG. 2.

As shown in FIG. 5, a DRAM 92 that includes the DRAM portion 40 of FIG. 2 is fabricated on the surface of a semiconductor wafer 94. The wafer 94 may comprise a sliced wafer of silicon, or may comprise any one of a wide variety of substrates, including, for example, a Silicon-on-Sapphire (SOS) substrate, a Silicon-on-Insulator (SOI) substrate, or a Silicon-on-Glass (SOG) substrate.

Although the present invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A method of testing a semiconductor memory, the method comprising switchably coupling a sense device of the semiconductor memory to at least two pairs of complementary bit conductors in the same memory sub-array of the semiconductor memory at substantially the same time during a test of the semiconductor memory.

2. The method of claim 1, wherein switchably coupling comprises activating at least two pairs of isolation NMOS transistors coupled between the sense device and the at least two pairs of complementary bit conductors.

3. A method of testing a semiconductor memory, the method comprising:

coupling one pair of bit conductors to at least two pairs of transistors of the semiconductor memory;

substantially simultaneously activating a first pair of the at least two pairs of transistors with a first signal and a second pair of the at least two pairs of transistors with a second signal; and sensing a voltage on the pair of bit conductors with a sense device.

4. The method of claim 3, wherein coupling one pair of bit conductors to the at least two pairs of transistors is coupling a first pair of bit conductors to the at least two pairs of transistors, the method further comprising coupling each of the at least two pairs of transistors of the semiconductor memory to at least a second pair of bit conductors.

5. The method of claim 3, wherein coupling comprises activating at least two pairs of isolation NMOS transistors coupled between the sense device and the pair of bit conductors.

6. A method of testing a semiconductor memory, the method comprising:

providing a sense device shared by at least one sub-array of the semiconductor memory;

coupling one pair of bit conductors to at least two pairs of transistors;

substantially simultaneously activating a first pair of the at least two pairs of transistors with a first signal and a second pair of the at least two pairs of transistors with a second signal; and sensing a voltage on the pair of bit conductors with a sense device.

7. The method of claim 6, wherein the at least one sub-array of the semiconductor memory is at least two sub-arrays and the pair of bit conductors is a first pair of bit conductors associated with a first memory sub-array, the method further comprising:

deactivating the first pair of the at least two pairs of transistors;

deactivating the second pair of the at least two pairs of transistors;

coupling a second pair of bit conductors associated with a second memory sub-array to at least two pairs of transistors substantially simultaneously activating a third pair of the at least two pairs of transistors with a third signal and a fourth pair of the at least two pairs of transistors with a fourth signal; and sensing a voltage on the second pair of bit conductors with the sense device.

8. A semiconductor memory comprising:

a sense device coupled to at least one of a plurality of pairs of complementary bit conductors within a memory sub-array of the semiconductor memory through at least one pair of switches;

at least another pair of switches coupled between the sense device and at least another of the plurality of pairs of complementary bit conductors within the memory sub-array; and activating circuitry coupled to both the at least one and the at least another pairs of switches.

9. The semiconductor memory of claim 8, wherein the sense device is a sense amplifier.

10. The semiconductor memory of claim 8, wherein the switches are NMOS transistors.

11. The semiconductor memory of claim 8, wherein the activating circuitry comprises a combination of NMOS and PMOS transistors.

12. A method of testing semiconductor memory, the method comprising:

providing a sense device shared by at least two sub-arrays of the semiconductor memory;

coupling a first pair of bit conductors associated with a first memory sub-array to at least two pairs of transistors;

substantially simultaneously activating a first pair of the at least two pairs of transistors with a first signal and a second pair of the at least two pairs of transistors with a second signal;

sensing a voltage on the pair of bit conductors with a sense device;

deactivating the first pair of the at least two pairs of transistors;

deactivating the second pair of the at least two pairs of transistors;

coupling a second pair of bit conductors associated with a second memory sub-array to at least two pairs of transistors;

substantially simultaneously activating a third pair of the at least two pairs of transistors with a third signal and a fourth pair of the at least two pairs of transistors with a fourth signal; and sensing a voltage on the second pair of bit conductors with the sense device.

* * * * *

UNITED STATES PATENT AND TRADEMARK OFFICE
CERTIFICATE OF CORRECTION

PATENT NO. : 6,169,696 B1
DATED : January 2, 2001
INVENTOR(S) : Lucien J. Bissey It is certified that error appears in the above-identified patent and that said Letters Patent is hereby corrected as shown below:

<u>Title page,</u>
Item [56], References Cited, U.S. PATENT DOCUMENTS, before "8/ 1994" delete "*"

<u>Column 3,</u>
Line 38, in TABLE 2, change "Bitlines Read" to -- Bitlines tested --
Lines 58 and 64, after "circuitry" and before "70" insert -- sub-array --

<u>Column 5,</u>
Line 20, insert a semicolon after "transistors"

Signed and Sealed this

Thirtieth Day of March, 2004

JON W. DUDAS
*Acting Director of the United States Patent and Trademark Office*